(12) United States Patent
Evans et al.

(10) Patent No.: US 7,000,417 B2
(45) Date of Patent: Feb. 21, 2006

(54) SUPER COOLER FOR A HEAT PRODUCING DEVICE

(75) Inventors: Nigel Evans, West Midlands (GB); William E. Hewlett, Burton on Trent (GB)

(73) Assignee: Production Resource Group, Inc., New Windsor, NY (US)

( * ) Notice: Subject to any disclaimer, the term of this patent is extended or adjusted under 35 U.S.C. 154(b) by 0 days.

(21) Appl. No.: 10/794,258

(22) Filed: Mar. 4, 2004

(65) Prior Publication Data

US 2004/0168444 A1 Sep. 2, 2004

Related U.S. Application Data

(60) Continuation of application No. 10/375,165, filed on Feb. 25, 2003, now Pat. No. 6,775,991, which is a continuation of application No. 10/128,774, filed on Apr. 22, 2002, now Pat. No. 6,523,353, which is a division of application No. 09/780,025, filed on Feb. 9, 2001, now Pat. No. 6,430,934.

(60) Provisional application No. 60/181,530, filed on Feb. 10, 2000.

(51) Int. Cl.
*F25D 23/12* (2006.01)

(52) U.S. Cl. .............................. 62/259.2; 62/3.2; 62/3.7
(58) Field of Classification Search ................. 62/3.2, 62/259.2, 3.7, 3.6, 3.1; 165/80.2, 80.3
See application file for complete search history.

(56) References Cited

U.S. PATENT DOCUMENTS

| | | |
|---|---|---|
| 4,848,090 A | 7/1989 | Peters |
| 5,097,829 A | 3/1992 | Quisenberry |
| 5,515,682 A | 5/1996 | Nagakubo et al. |
| 5,609,032 A | 3/1997 | Bielinski |
| 5,793,452 A | 8/1998 | Miyawaki |
| 5,912,773 A | 6/1999 | Barnett et al. |
| 5,953,151 A | 9/1999 | Hewlett |
| 6,012,291 A | 1/2000 | Ema |
| 6,098,408 A | 8/2000 | Levinson et al. |
| 6,208,087 B1 | 3/2001 | Hughes et al. |
| 6,224,216 B1 | 5/2001 | Parker et al. |
| 6,430,934 B1 * | 8/2002 | Evans et al. ............. 62/3.2 |
| 6,523,353 B1 * | 2/2003 | Evans et al. ............. 62/3.2 |
| 6,775,991 B1 * | 8/2004 | Evans et al. ............. 62/3.2 |

* cited by examiner

*Primary Examiner*—Melvin Jones
(74) *Attorney, Agent, or Firm*—Fish & Richardson P.C.

(57) ABSTRACT

A super cooler device including a thermo electric cooler on a digital micro mirror device.

42 Claims, 3 Drawing Sheets

SUPER COOLER FOR A HEAT PRODUCING DEVICE

CROSS-REFERENCE TO RELATED APPLICATIONS

This application is a continuation of U.S. application Ser. No. 10/375,165, filed Feb. 25, 2003 now U.S. Pat. No. 6,775,991, which is a continuation of U.S. application Ser. No. 10/128,774, filed Apr. 22, 2002 now U.S. Pat. No. 6,523,353, which is a divisional of U.S. application Ser. No. 09/780,025, filed Feb. 9, 2001 now U.S. Pat. No. 6,430,934, which claims the benefit of U.S. provisional application Ser. No. 60/181,530 filed Feb. 10, 2000.

SUMMARY

The present application relates to cooling of a heat producing device, using a thermoelectric cooler arranged as a super cooler. More specifically, the present application teaches cooling of a device, such as a digital mirror device, which requires a specified temperature gradient across the device, using a supercooled element.

BACKGROUND

Electronic devices often have specified cooling requirements. One device that has specific cooling requirements is a digital micromirror device ("DMD") available from Texas Instruments ("TI"). The manufacturer of this device has specified a maximum overall temperature for the device and also a specified maximum temperature gradient between the front and rear faces of the device during operation.

For example, the temperature of the specific DMD used in this application needs to be kept below 55° C., however, in this application it is desirable to keep the device at or below ambient. This may allow operation in an ambient environment up to 55° C., such as may be encountered in a stage theater or studio environment. The temperature differential between the front and rear of the DMD cannot exceed 15°. Besides the heat from the operation of the DMD itself, large amounts of heat from a high intensity light source must be dissipated.

BRIEF DESCRIPTION OF THE DRAWINGS

These and other aspects will now be described in detail with reference to the accompanying, wherein.

DETAILED DESCRIPTION

According to the present system, a "supercooler" device, is used to monitor and control the temperature of a device which can control light on a pixel-by-pixel basis, e.g. a digital mirror device (DMD).

Figure 1:
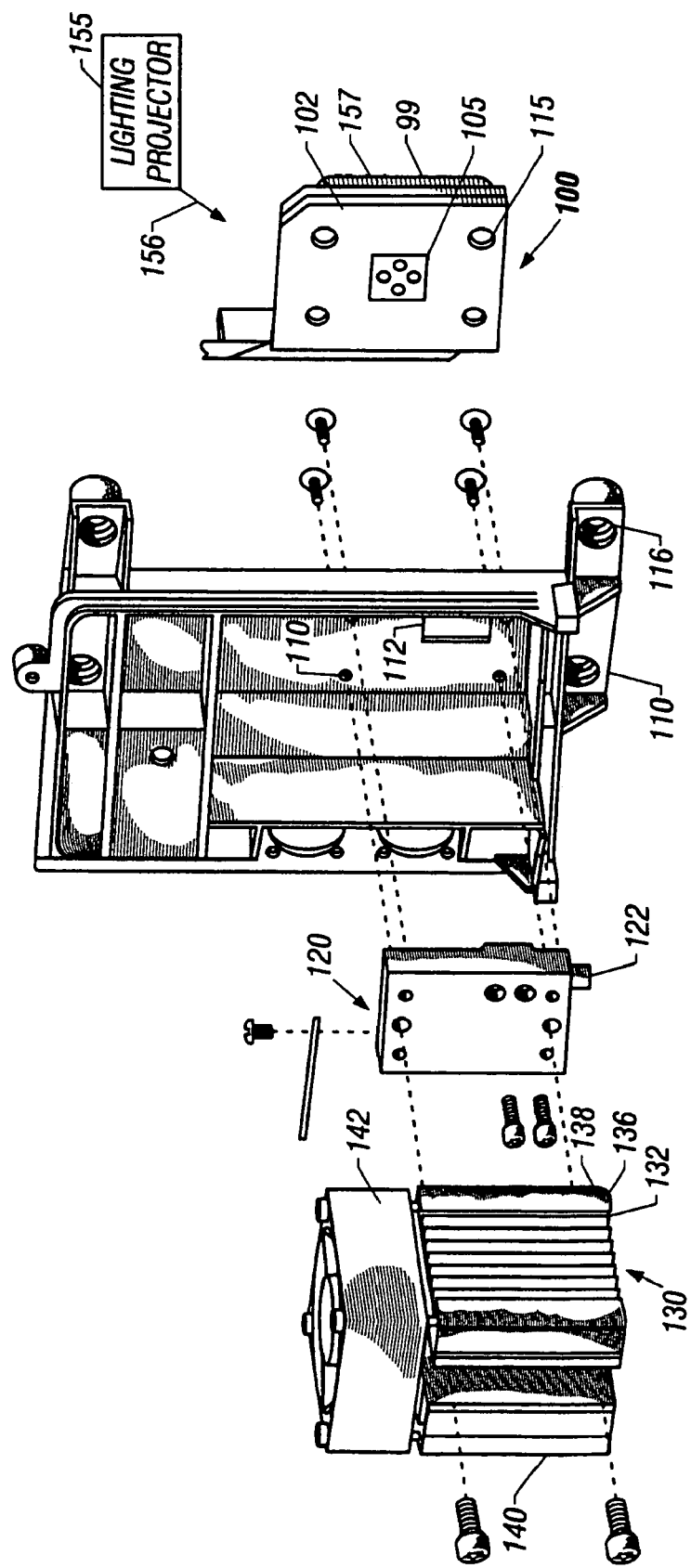
FIG. 1 shows an exploded diagram of the parts making up the supercooler assembly.

The mechanical structure of the supercooling assembly is shown in FIG. 1. The pixel element is a DMD 99, which forms part of a DMD assembly 100. As shown, a thermal connection 105 to the DMD 99 is provided. A lighting projector 155 projects light 156 on the front surface 157 thereof.

A cold plate 120 is assembled to a mounting bracket 110 in a manner which allows minimal thermal transfer between the two components. The DMD is attached directly to the cold plate 120, hereby allowing maximum thermal transfer between the DMD and cold plate 120, but minimal thermal transfer to the mounting bracket 110. The rear surface of the cold plate 120 is directly connected to one side of the thermoelectric device 130, and the other side of the thermoelectric device is connected to a heat sink/fan assembly 140.

Insulating foam gaskets are fitted around the DMD rear stud, the cold plate, and the thermoelectric device in order to isolate them from the outside ambient air. This improves the efficiency of the cooling system by eliminating the effects of condensation and properly controlling the flow of heat from the DMD to the cold plate, through the thermoelectric device, and into the heat sink/fan assembly.

The thermoelectric cooler element 130 operates as conventional to produce one cold side 131 and one hot side 132. The hot side is coupled to the heat sink/fan assembly 140 to dissipate the heat. In a preferred mode, the heat sink/fan assembly is columnar is shape, with a substantially square cross section. This facilitates using a square shaped fan housing 142. The square shaped fan unit allows the maximum use of the space for a fan, whose blades usually follow a round shape. Any type of cooling fan, however can be used.

The DMD assembly 100 has an extending rear stud 105 which is covered with thermal grease. This stud extends though a hole 112 in the bracket assembly 110.

The plate 120 is actively cooled, and hence becomes a "cold plate". The active cooling keeps the metal plate at a cooled temperature, and the thermal characteristics of the plate material allow the heat flowing into the plate from the DMD to be evenly distributed throughout the entire plate. The plate is preferably about ¼" to ⅜" in thickness, and of comparable outer size to the thermal contact area of the thermoelectric cooler element 130. This allows the localized and concentrated heat at the rear stud of the DMD to be evenly dissipated through the cold plate and then efficiently transferred through the full surface area of the thermoelectric cooler element. As shown, the assembly employs thermal insulation techniques such as fiber/plastic sleeves and washers in the mounting of components, in order to prevent heat transfer via mounting screws etc. Since this heat transfer could be uncontrolled, it could otherwise reduce the cooling efficiency.

Figure 2:
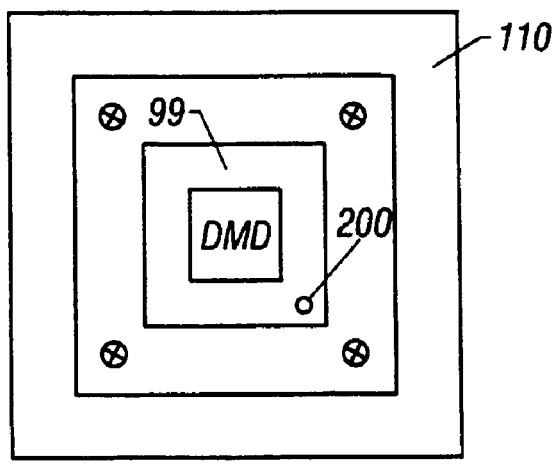
FIG. 2 shows the rear of the DMD and parts which are assembled to the DMD.

The front of the DMD is shown in FIG. 2. Temperature sensor 200 is mounted to have a fast response to temperature changes. A second temperature sensor 122 is mounted to the cold plate 120 and effectively measures the temperature of the rear of the DMD 99. This second temperature sensor 122 therefore monitors the back temperature.

The hot side 132 of the thermoelectric cooler is coupled to a heat sink assembly 130. The heat sink assembly 140 includes a heat sink element 140. As shown, the device has fins and a top-located cooling fan 142.

Figure 3:
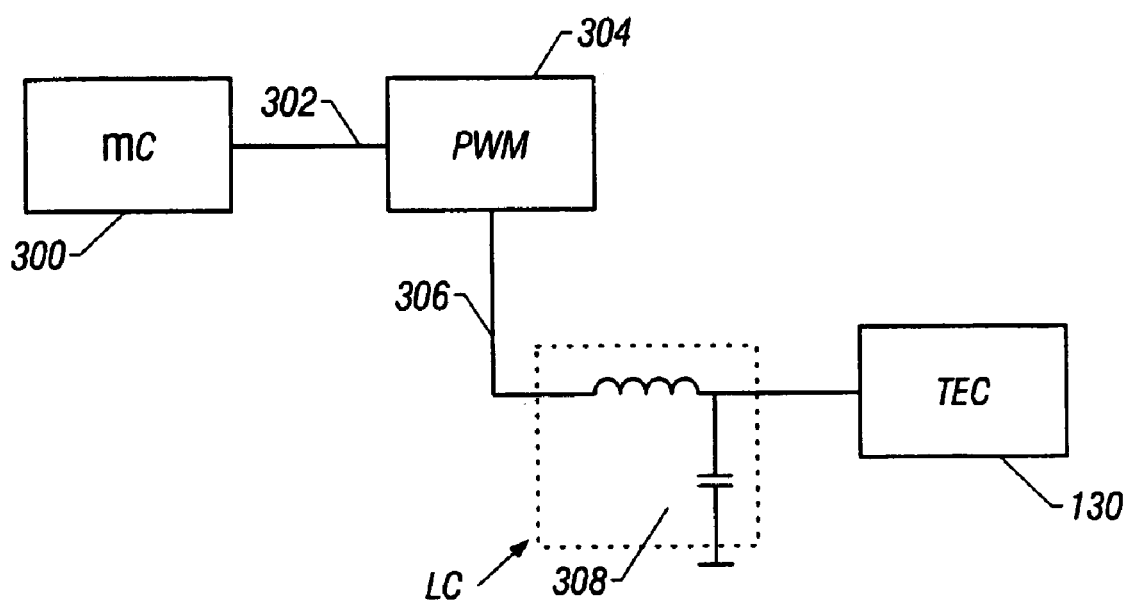
FIG. 3 shows a circuit for driving a thermoelectric cooler.

A block diagram of the control system is shown in FIG. 3. Controller 300 operates in a closed loop mode to maintain a desired temperature differential across the sensors 122, 200.

One important feature of the present application is that the thermoelectric cooler is controlled to maintain the temperature of the DMD at the desired limits. These limits are set at a target of 16° C. on the front, and a differential no greater than 15° between front and rear. The thermoelectric cooler is controlled using very low frequency or filtered pulse width modulation. In a first embodiment, the controlling micro controller 300 produces an output 302, e.g., digital or analog. This drives a pulse width modulator 304. The output of the pulse width modulator is a square wave 306 or a signal close to a square wave, with sufficient amplitude and power to produce the desired level of cooling down the thermoelectric cooler. The square wave is coupled to an LC filter 308 which has a time constant effective to smooth the 20 KHz switching frequency. The output to the thermoelectric cooler is therefore a DC signal. This drives the thermoelectric cooler 130 and causes it to produce a cooling output. In a second embodiment, the LC filter is removed and the TEC is driven directly by the square wave 306 at a lower frequency, e.g. 1 Hz.

Figure 4:
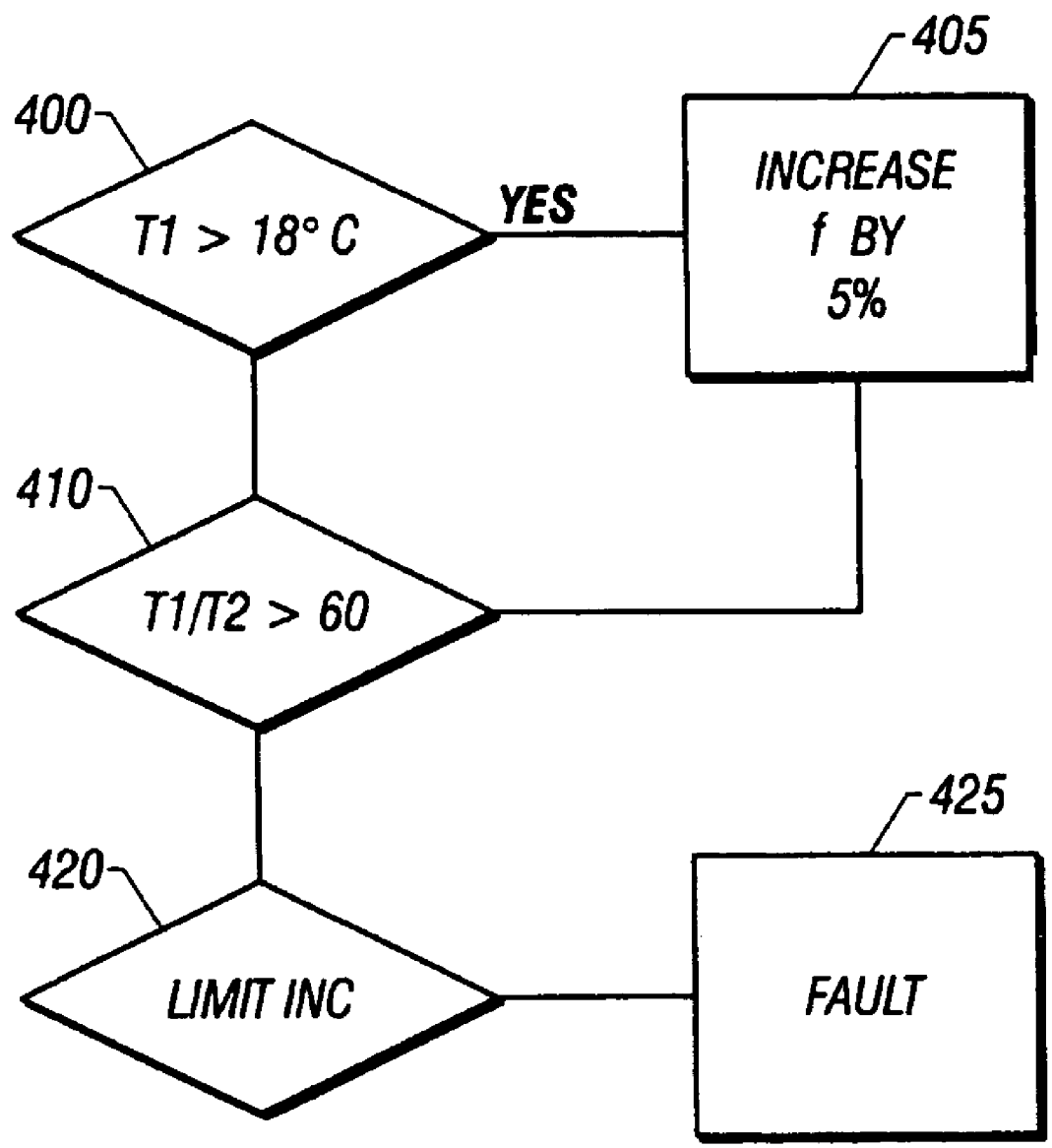
FIG. 4 shows a flowchart of operation.

The microcontroller operates according to the flowchart of FIG. 4. Step 400 determines if the temperature of the first temperature sensor T1 is greater than 16°. If so, the output to the TEC remains "on", resulting in further cooling. When the temperature falls below 16°, the drive to the TEC is switched off. The sample period is approximately ½ second between samples.

At 410, the system checks temperature of the first sensor (T1) and of the second sensor (T2) to determine if the differential is greater than 15°. If so, the output is switched "on". Step 420 indicates a limit alarm, which represents the time of increase if the rate of change continues. If the rate of change continues to increase, as detected at step 420, a fault is declared at step 425. This fault can cause, for example, the entire unit to be shut off, to reduce the power and prevent permanent damage.

Other embodiments are contemplated.

What is claimed:

1. A light controlling system, comprising:
   a light controlling device which is controllable to control light on a pixel-by-pixel basis;
   a mounting structure for said light controlling device; and
   a condensation eliminating part, coupled to said light controlling device, and insulating at least one part of said light controlling device to eliminate condensation formed thereon.

2. A light controlling system as in claim 1, wherein said mounting structure further includes a heatsink.

3. A light controlling structure as in claim 2, further comprising an active cooling part for the light controlling device.

4. A light controlling system as in claim 1, wherein said light controlling device is a digital mirror device (DMD).

5. A light controlling system as in claim 2, wherein said heat sink is substantially columnar in shape, having a square cross-section, having a fan in communication with the square cross-section, and having a contact surface in thermal contact with said light controlling device.

6. A light controlling system as in claim 5, wherein said fan blows air in a direction that is substantially parallel to a rear surface of the light controlling device.

7. A light controlling system as in claim 1, further comprising at least one temperature sensor, sensing at least one temperature of said light controlling device.

8. A method, comprising:
   using a light controlling device to control pixel by pixel reflection of light applied thereto; and
   cooling said light controlling device while reducing an amount of condensation formed on said light controlling device.

9. A method as in claim 8, wherein said light controlling device is a digital mirror device (DMD).

10. A method as in claim 8, wherein said cooling comprises actively cooling a light controlling device.

11. A method as in claim 8, wherein said cooling comprises using a heatsink and fan to cool the light controlling device.

12. A method as in claim 11, wherein said cooling comprises thermally attaching a heatsink and fan to a surface of the light controlling device, and using the fan to blow in a direction substantially parallel to said surface.

13. A method as in claim 8, further comprising sensing a temperature of at least one surface of the light controlling device.

14. A system comprising:
    a light controlling device, which is controllable to control light on a pixel by pixel bases, having a first surface for reflecting light, and having a second surface opposite said first surface; and
    a heatsink and fan assembly having a first surface which is shaped to thermally connect to said second surface of said light controlling device, and having a fan operative to cool said first surface.

15. A system as in claim 14, wherein said heat sink and fan is substantially columnar in shape with a substantially square cross-section.

16. A system as in claim 14, wherein said first surface comprises a side surface of said heatsink and fan assembly, and wherein said fan blows air in a direction substantially parallel to said first surface, and faces in a direction substantially orthogonal to said side surface.

17. A system as in claim 14, wherein said light controlling device is a digital mirror device (DMD).

18. A system as in claim 17, wherein said second surface comprises a cooling stud, and further comprising a heat spreading part, coupled to said cooling stud.

19. A system as in claim 14, further comprising a temperature sensor, coupled to said light controlling device.

20. A system as in claim 19, further comprising a controller, responsive to said temperature sensor, operating to control an amount of cooling of said light controlling device.

21. A system as in claim 19, wherein said temperature sensor includes at least one temperature sensor sensing information related to a front temperature of the light controlling device and at least another temperature sensor sensing information related to a rear temperature of the light controlling device.

22. A system as in claim 14, further comprising at least one insulated part coupled to at least one surface of said light controlling device, preventing said at least one surface from being cooled.

23. A method, comprising;
    using the light controlling device to reflect light that impresses on a light reflecting surface, on a pixel by pixel basis;
    cooling a surface of the light controlling device which does not actually receive the light; and
    wherein said cooling comprises connecting a heatsink to said surface of said light controlling device, and cooling the heatsink by blowing air in a direction substantially parallel to said light reflecting surface of the light controlling device.

24. A method as in claim 23, wherein said light controlling device is a digital mirror device (DMD).

25. A method as in claim 23, further comprising sensing at least one temperature of the light controlling device, and using the sensed temperature to control said cooling.

26. A method as in claim 25, wherein said sensing at least one temperature comprises sensing at least front temperature and rear temperature of the light controlling device.

27. A method as in claim 23, further comprising preventing at least one surface of the light controlling device from being cooled.

28. An apparatus, comprising:
a light controlling device which is electrically actuable to control light on a pixel-by-pixel bases;
a temperature sensing device, sensing at least one temperature of said light controlling device; and
a cooling part, thermally coupled to said light controlling device, and operative to cool said light controlling device based on said at least one temperature which was sensed by said temperature sensing device.

29. An apparatus as in claim 28, wherein said cooling part includes an active cooling part.

30. An apparatus as in claim 28, wherein said cooling part includes a passive cooling part with a fan and heatsink.

31. An apparatus as in claim 30, wherein said fan and heatsink includes a first surface thermally coupled to said light controlling device, and which provides airflow in a direction substantially parallel to a direction of said first surface.

32. An apparatus as in claim 28, wherein said light controlling device is a digital mirror device.

33. An apparatus as in claim 28, wherein said temperature sensing device senses at least a front temperature of the light controlling device and a rear temperature of the light controlling device.

34. An apparatus as in claim 28, further comprising an insulation part, which insulates at least one part of said light controlling device against cooling.

35. A method, comprising:
using a light controlling device which is electrically able to control light on a pixel by pixel basis;
sensing at least one temperature of said light controlling device and producing an output indicative thereof; and
cooling the light controlling device based on said output.

36. A method as in claim 35, wherein said cooling comprises actively cooling the light controlling device.

37. A method as in claim 36, wherein said actively cooling comprises using a thermoelectric device to cool the light controlling device.

38. A method as in claim 35, wherein said cooling comprises passively cooling the light controlling device.

39. A method as in claim 38, wherein said passively cooling comprises using a fan and heatsink to cool the light controlling device.

40. A method as in claim 35, wherein said sensing comprises sensing a temperature related to a front surface temperature of the light controlling device and sensing a second temperature related to a rear surface temperature of the light controlling device.

41. A method as in claim 35, further comprising insulating at least one surface of the light controlling device against cooling.

42. A method as in claim 35, wherein said light controlling device is a digital mirror device (DMD).

* * * * *